United States Patent [19]

Bezama et al.

[11] Patent Number: 5,444,287
[45] Date of Patent: Aug. 22, 1995

[54] THERMALLY ACTIVATED NOISE IMMUNE FUSE

[75] Inventors: Raschid J. Bezama, Mahopac; Dominic J. Schepis, Wappingers Falls, both of N.Y.; Krishna Seshan, San Jose, Calif.

[73] Assignee: International Business Machines Corporation, Armonk, N.Y.

[21] Appl. No.: 292,901

[22] Filed: Aug. 10, 1994

[51] Int. Cl.⁶ ................ H01L 29/167; H01L 23/48; H01L 29/207
[52] U.S. Cl. ........................... 257/467; 257/530
[58] Field of Search ........................ 257/467, 530

[56] References Cited

U.S. PATENT DOCUMENTS

| | | | |
|---|---|---|---|
| 4,752,118 | 6/1985 | Johnson | 350/334 |
| 4,774,561 | 9/1988 | Takagi | 357/65 |
| 4,984,054 | 1/1991 | Yamada et al. | 357/51 |
| 5,049,969 | 9/1991 | Orbach et al. | 357/51 |
| 5,084,691 | 1/1992 | Lester et al. | 337/297 |
| 5,196,724 | 3/1993 | Gordon et al. | 257/530 |

Primary Examiner—Stephen D. Meier
Attorney, Agent, or Firm—H. Daniel Schnurmann

[57] ABSTRACT

A noise immune fuse having sub-micron dimensions which can be programmed by an electrically and thermally synchronized event. The fuse includes a pair of fuse links in close proximity of each other, a layer of thermally conductive and electrically insulating material thermally coupling the two links forming the pair, and means for programming the first link by prompting the second link to gate the energy transfer between the links via the coupling layer. By combining thermal and electrical pulses to perform the programming function, the reliability of the fuse structure is greatly enhanced when compared to that of a single element fuse.

19 Claims, 6 Drawing Sheets

THERMALLY ACTIVATED NOISE IMMUNE FUSE

FIELD OF THE INVENTION

This invention relates to the design and structure of an electrically programmable fuse for use in VLSI circuits, and more particularly to the design of a scaled down fuse which displays noise immunity, thereby preventing its being accidentally programmed by a spurious noise signal.

BACKGROUND OF THE INVENTION

Electrically programmable fuses have been used extensively in the design and manufacture of Very Large Scale Integrated Circuits (VLSI).

Fuses are oftentimes used for redundancy purposes, wherein certain defective regions within an integrated circuit (IC) chip or an IC assembly can be electrically disconnected and replaced by a functional region. This technique of programming fuses has the advantage of increasing yield and adding flexibility to the circuit designer, providing ease of "repair", e.g., engineering changes (EC), in a manner well known to those skilled in the art.

Typically, a fuse may be programmed by a laser in an operation known as "laser zapping", wherein the fuse is physically heated and ablated. Other programming techniques include passing an electrical current through the fuse link in the form of a pulse such that the fuse resistance causes joule heating, which thermally melts and electrically isolates electrical interconnections from one another. In both instance, energy is applied directly to the fuse during the programming phase.

By way of example, in UK Patent No. 2,237,446 A to Machida et al., a process is described wherein an opening is formed over a fuse having two terminals which connect the fuse to external wiring and to a programming source. A fuse according to the teachings of Machida et al.is shown in FIGS. 1a and 1b.

Alternatively, in a second typical fuse layout, energy can be applied indirectly to the fuse, as shown in FIGS. 2a and 2b. This layout is described in U.S. Pat. No. 5,084,691 to Lester et al., wherein a controllable fuse having a heating element (or elements) 12 is shown to provide sufficient energy to melt a low temperature solder alloy 11. The fuse is disconnected by the source of energy placed in close vicinity to the fuse which raises the melting temperature to a level sufficiently high to ensure discontinuity.

Inherent to fuses of the type described by Machida et al. and Lester et al. as well as by similar structures known in the art, are two terminals through which current passes during the programming phase of the fuse. Common to all fuses is a combination of joule heat and electrical current through two terminals which actually causes the fuse to become discontinuous.

While the teachings of fuse formation and integration are well understood by those skilled in the art, fuses of these types suffer from serious drawbacks.

First, when an IC chip is powered, transient currents and voltage "spikes" are always present in the wiring which cause the power in the lines to fluctuate. This situation is increasingly important as chip integration increases and the circuit dimensions are scaled down to submicron range. Second, oftentimes, electrical noise in the environment can cause voltage fluctuations which can exceed the specifications of the IC chip design. If either of these fluctuations or noise "spikes" occur, it is conceivable that a fuse of the type previously described may reach a point above the threshold required for accidental programming, thereby inadvertently "blowing" the fuse.

OBJECTS OF THE INVENTION

Accordingly, it is a primary object of the present invention to provide a fuse which is noise immune, i.e., to protect it from electrical noise which can trigger an accidental programming.

It is another object to provide a fuse structure which can be programmed by passing through the fuse a relatively low current.

It is yet another object to provide a method of fabricating a fuse with minimal additions to standard CMOS (Complementary Metal Oxide Semiconductor) or BiC-MOS (Bipolar CMOS) process fabrication techniques.

It is still another object to provide a fuse structure with a programming capability that minimizes the creation of debris during the "blow" phase.

It is a further object to provide a fuse structure that can be scaled down to integrated circuit dimensions.

It is a more particular object to provide a fuse structure that can be programmed long after the IC chip has been mounted on the next level of assembly (e.g, module or card).

SUMMARY OF THE INVENTION

In accordance with these and other objects of the invention, in an integrated circuit having a substrate insulated by an insulating layer, there is provided a programmable fuse structure that comprises a substrate insulated by an insulating layer, a programmable fuse structure comprising a pair of current carrying fuse links on the insulating layer, the fuse links in close proximity of each other; a coupling layer of thermally conductive material, the pair of fuse links being thermally coupled by the layer; and means for programming the first link of the pair of fuse links by activating the second link of the pair of fuse links to transfer energy from the second link of the pair to the first link via the layer of thermally conductive material.

BRIEF DESCRIPTION OF THE DRAWINGS

The invention will be described further, by way of a preferred example thereof, with reference to the accompanying drawings wherein like reference numerals have been used in the several views to depict like elements. In the drawings.

DETAILED DESCRIPTION OF THE INVENTION

Figure 1A:
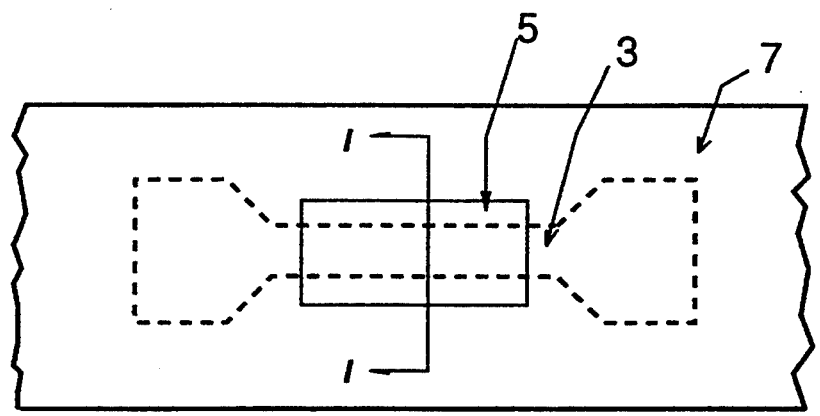
FIGS. 1a–1b are schematic diagrams of a first prior art fuse structure.
Figure 1B:
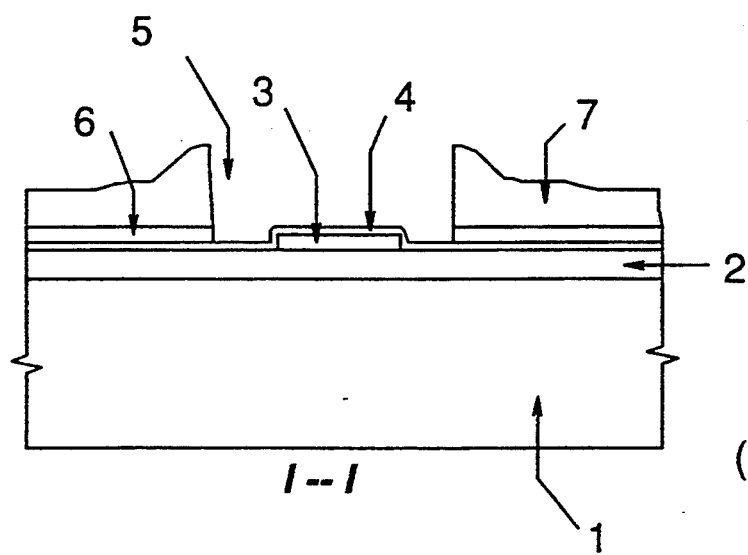
Figure 2A:
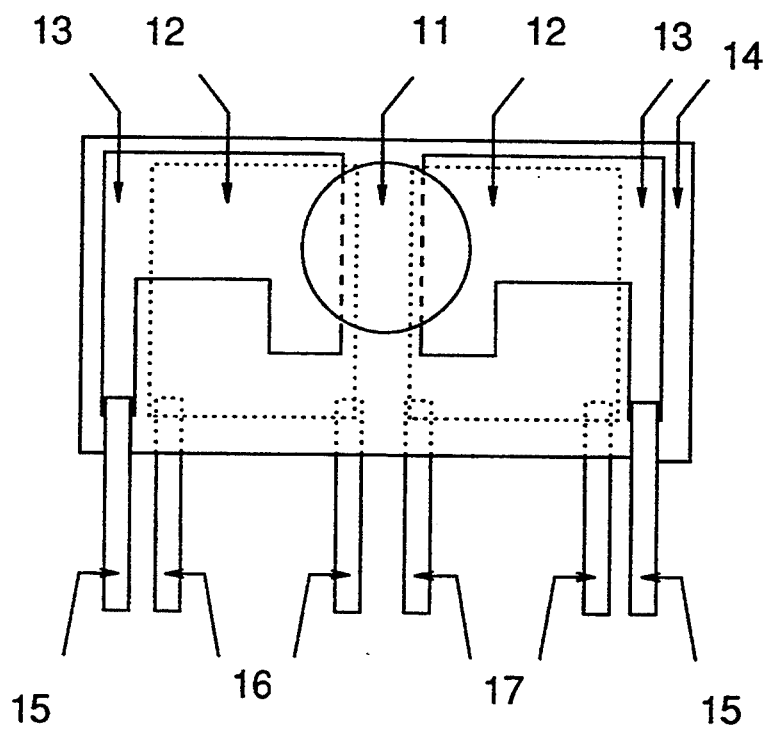
FIGS. 2a–2b are schematic diagrams of a second prior art fuse structure.
Figure 2B:
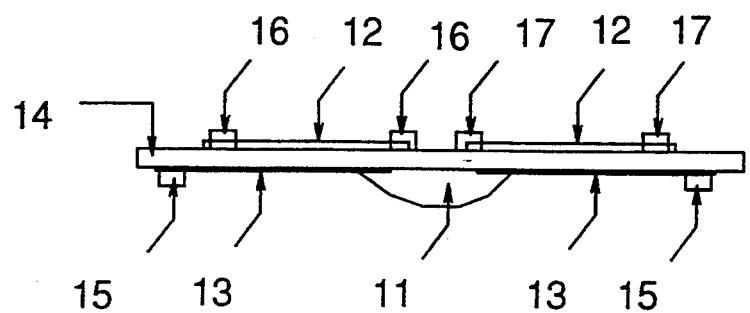
Figure 3:
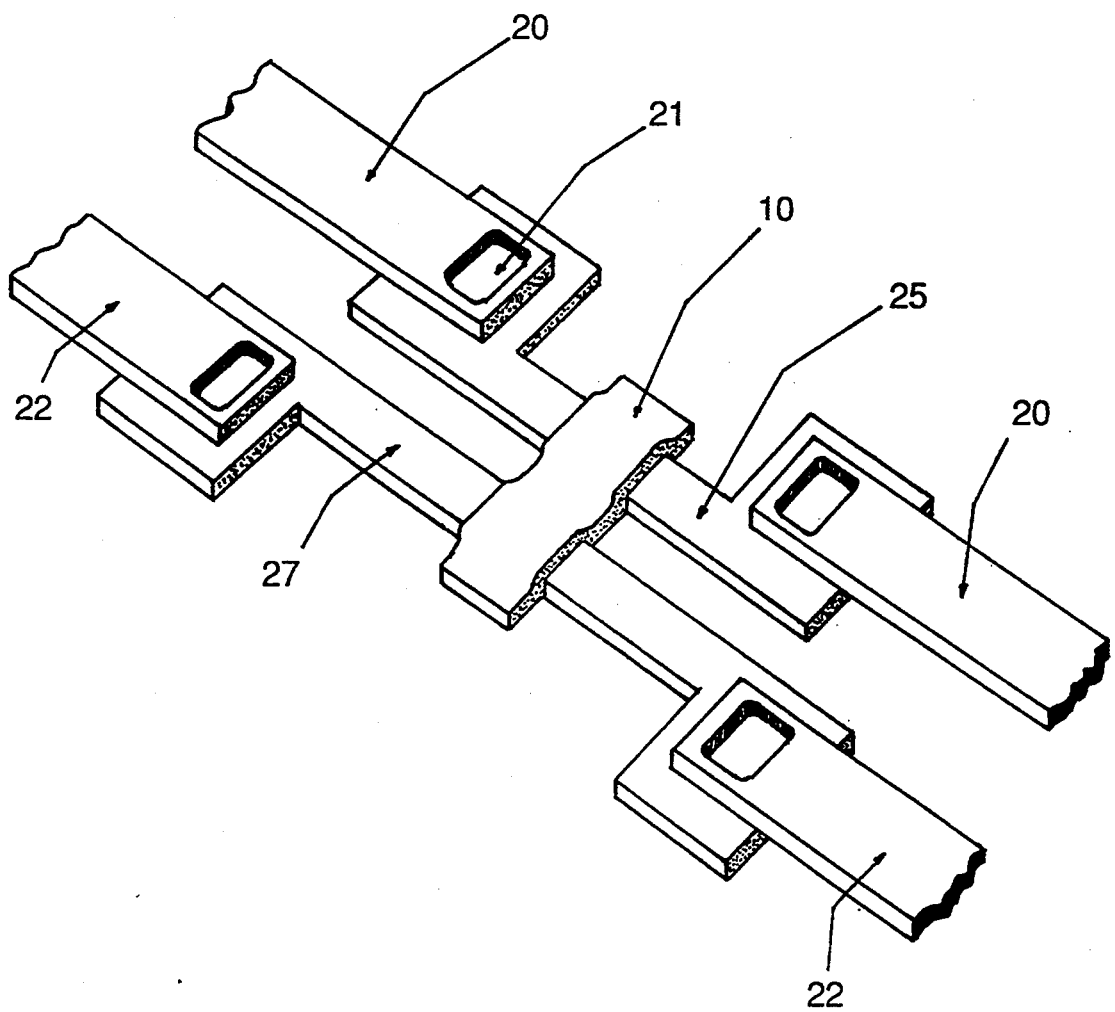
FIG. 3 is a diagram showing a perspective 3-dimensional view of the fuse structure in accordance with the present invention.

Referring now to FIG. 3, showing a fuse structure in accordance with the teachings of the present invention, a fuse link 25 is electrically connected to terminals 20, which in turn are attached to a power supply. A second link 27 with connecting terminals 22, is placed in close proximity to fuse link 25. (i.e., as close as current lithographic processes allow it, typically in the order of 0.5 microns), using a similar but not identical design to fuse link 25. A thermal conduction element 10 is used as an electrical insulator and thermal conductor to facilitate programming of the fuse. If a voltage is applied independently to fuse links 25 and 27, neither fuse link will "blow". The fuse structure is designed to be sufficiently robust that even large variations of electrical noise in the circuit will be inadequate to cause the fuse to be programmed. During the programming phase, current is passed simultaneously through fuses 25 and 27, such that a certain amount of joule heating is generated in both elements. The thermal conduction layer 10 prevents heat loss from the fuse 25 to an extent that the fuse reaches its melting point when current is present in both lines. The current passing through both fuse links can be in the form of synchronized pulses that are applied sequentially within a very short delay span or, alternatively, as pulses that occur simultaneously.

In a second preferred embodiment, fuse links 25 and 27 can be arranged to pass over and under one another, producing the same effects as those described earlier. In such an arrangement, the thermal coupling material must electrically separate both fuse links.

As previously mentioned, fuse links 25 and 27 are covered or overlapped by an insulating layer 10 and are built over an insulating layer 2. The fuse link 25 is the primary fuse designed to be part of the electrical circuitry that is used to enable programming. Link 27 is the secondary fuse, and it is designed to be part of the electrical circuitry that enables programming the primary fuse.

Both primary fuse 25 and secondary fuse 27 are designed to be active elements, (an active element is defined as capable of "blowing" if sufficient energy is provided to either fuse link). However, to provide a simpler manufacturing and control process, it is recommended that the fuses not be made with similar blowing characteristics, but to provide the primary fuse with higher power generation capability than the secondary fuse 27. Such task can easily be achieved by controlling the length of the fuse link when the fuses are built with similar thickness, width and composition, while allowing the fuse links to operate from the same voltage source.

Figure 4A:
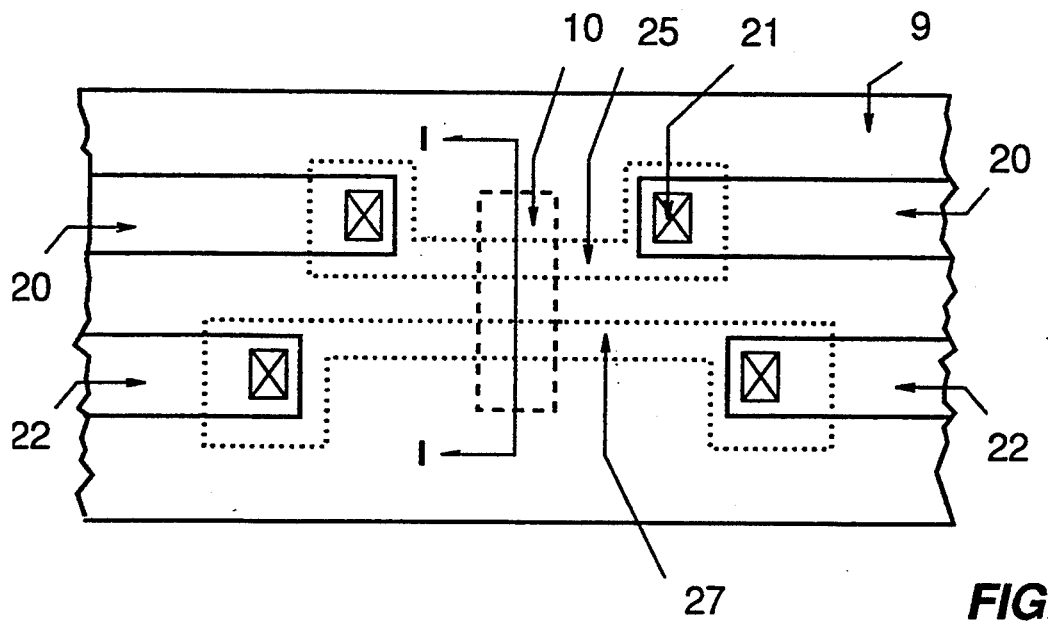
FIGS. 4a–4b are schematic diagrams of a top view and a lateral view, respectively, of the fuse structure in accordance with the present invention.
Figure 4B:
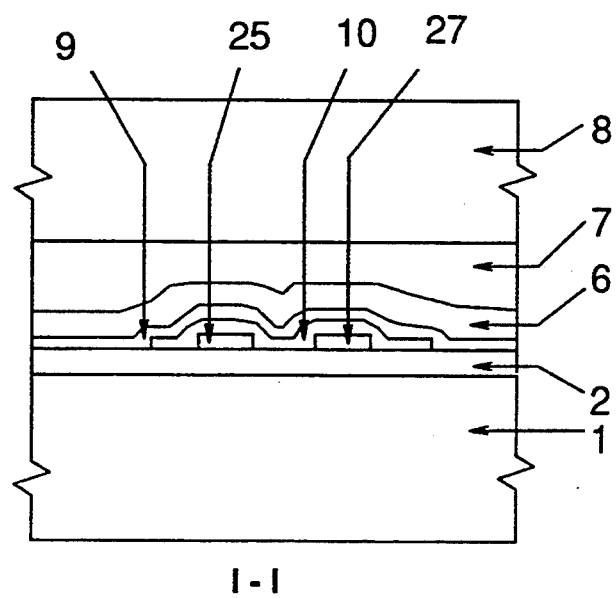

FIGS. 4a–4b show a planar (top) and cross-sectional (side) views of the fuse structure in accordance with the present invention. While the layout of the fuse in FIG. 3 shows two fuse links 25 and 27 connecting four contacts or terminals 20 and 22, respectively, it is understood by those skilled in the art that a plurality of fuse links similar to links 25 and 27 could be advantageously used in the design.

The thermal coupling layer 10 placed over the fuse links 25 and 27 provides a thermal link between both the primary fuse link 25 and the secondary fuse link 27. Thus, by its ability of transferring thermal energy to the primary fuse 25, the secondary fuse 27 has many of the attributes commonly assigned to a heating element. The thermal coupling layer 10 is made of any electrically insulating material with high thermal conductivity, such as BeO, $Al_3N_4$ or diamond. Practitioners of the art will readily appreciate that the above mentioned materials have been listed for illustrative purposes only, but variations in material composition will provide similar satisfactory results. Similarly, it is possible to build the same functionality by building both primary and secondary fuses at different levels within the structure as long as a thermal coupling layer 10 links both fuse elements.

The function of the secondary fuse element 27 is to orchestrate the energy dissipation rate of the primary fuse once the primary fuse has been energized at the programming level. When the secondary fuse is not active, energy can be dissipated rapidly from an active primary fuse through the thermal coupling layer 10 into the secondary fuse area and from both fuses to all surroundings. When the secondary fuse is activated, the energy dissipation rate from the primary fuse to the secondary fuse is reduced just as its potential to transfer energy via the thermal coupling layer is limited. By its ability of controlling the energy loss rate from the primary fuse link 25, the secondary fuse link 27 acquires the function commonly assigned to a gate element. Thus, during normal circuit operation, the temperature of the primary fuse is always greater than the temperature of the secondary fuse.

Layers 6, 7, and 8 shown in FIG. 4b illustrate that the fuses are generally buried under a plurality of layers deposited at the latter stages of a process, such as during the chip personalization phase. Typically, layer 6 could be an electrical insulator to isolate the device and the first metal layer. A material such as $SiO_2$ could be used for layer 6. Layer 7 is usually a planarizing layer and may be glass or an insulator that can be planarized by methods well known in the art. Finally, layer 8 can be formed on a planar structure and could be metal, polyimide or some other material suitable for wiring a chip or assembly. Layers 6, 7, and 8 were not shown in FIG. 3 since they are not considered an essential part of the invention.

The thermal performance of the fuse structure shown in FIG. 4a has been studied by building a thermal model using the finite elements method to illustrate the effectiveness of the fuse structure according to the present invention. Both fuse links are built over 5000Å deposition layer 2 of $SiO_2$ using layers 25 and 27 of polysilicon 2000Å thick. A 2000Å layer of BeO is then deposited over the fuse layers 25 and 27. The multilayer structure is then covered with $SiO_2$ insulation layers and polysilicon layers as needed to provide the electrical connections to the fuse links. Typical dimensions of the primary fuse link 25 are 2 microns by 0.5 microns, and of the secondary fuse link 27, 3 microns by 0.5 microns. The dimensions of the thermal coupling layer 10 are 1 micron by 2 microns. Experimentally, it has been determined that a fuse bearing these characteristics can be programmed by applying a voltage pulse for at least 0.4 microseconds when the fuse link material is in a molten state.

Fuses 25 and 27 are preferably made of doped polycrystalline silicon to make them conductive. Poly-silicon lines can be used advantageously as fuses, since their resistance is sufficiently high to provide adequate joule heating when pulsed. Certain polysilicon lines undergo a current induced resistance change (CIRC) behavior when pulsed. The doping and the grain size of the polysilicon can be optimized to enhance or retard this effect. It is also possible for the fuse to undergo a CIRC behavior to a lower resistance, and still blow if the current is maintained. The CIRC behavior is most common in p-type polysilicon than it is in n-type dope materials. It is also possible to form a silicide material (e.g., $TiSi_2$ or $WSi_2$) over the polysilicon which acts as a fuse but with the distinct advantage of not displaying the CIRC behavior. Practitioners of the art will fully appreciate that other conductive materials could alternatively be used with similar results.

Evaluation of the above described structure shows that steady state can be reached after 1 microsecond. The maximum temperature reached by the structure depends on the type of pulse applied. According to a preferred model, when a voltage pulse is applied only to the primary fuse, the maximum temperature that the primary fuse was found to reach is 1280° C., and the secondary fuse, 527° C. This energy is not sufficient to allow the primary fuse reach its melting point. When a voltage pulse is applied only to the secondary fuse, the primary fuse reaches 400° C. and the secondary fuse, 922° C. This, again, is not sufficient to "blow" the energized fuse. Finally, when a voltage pulse is simultaneously applied to both fuses, the primary fuse reaches its melting temperature 0.1 microseconds after energizing both fuses. The secondary fuse temperature does not exceed 1400° C. for more than 0.5 microseconds and reaches a maximum of 1416° C. when a 3 volt pulse is applied to the structure.

When the same voltage pulse is applied to both fuses, the secondary fuse is prevented from being accidentally blown by two protecting mechanisms: a longer time to reach the melting temperature that allows the primary fuse to "blow" long before it is possible to "blow" the secondary fuse, and a lower current applied to the fuse link of the secondary fuse when it is compared to the current flowing through the primary fuse. This results in increasing the time required to blow the secondary fuse above the 0.4 microseconds necessary to blow the primary fuse. However, it will be understood by those skilled in the art that either of the above protective mechanisms by themselves would suffice to prevent an accidental "blowing" of the secondary fuse.

Fabrication of a thermal noise immune programmable fuse is achieved using conventional semiconductor fabrication processes. On a planar substrate, an insulating layer such as $SiO_2$ is deposited, preferably as a blanket film. An appropriate fuse material, such as polycrystalline silicon, approximately 0.2 μm thick, is likewise deposited as a blanket film. Using conventional photolithographic techniques, the primary and secondary fuse links are developed and simultaneously etched using a single mask, thereby ensuring that the distance between the fuses remains constant. A typical distance between the two fuse links is of the order of 0.5 μms, but it may vary depending on the desired model. The fuses are etched using an anisotropic etch performed in a reactive-ion-etch tool, using a gas such as $CF_4$. The thermal conductive layer, e.g., BeO is then deposited as a blanket film over the fuse structure. The thermal layer can be selectively removed from the wafer leaving a strip of material that connects and overlaps the two fuse links. An insulating layer of, e.g., $SiO_2$, is then deposited to passivate all the surfaces. Contact level lithography is used to open contacts over the two terminals of both fuse links. The resulting structure is shown in FIGS. 3 and 4a–4b.

Figure 5:
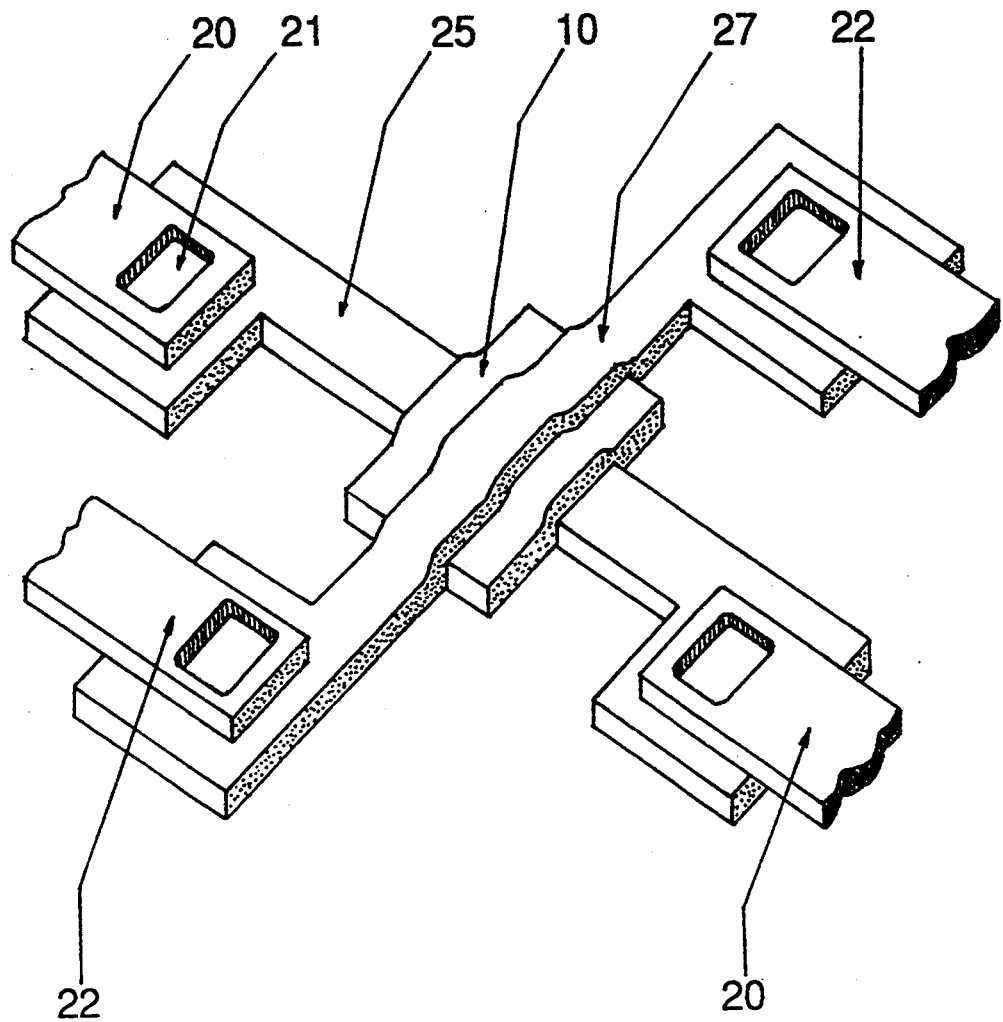
FIG. 5 is a schematic diagram of a perspective three-dimensional view of the fuse structure, wherein the second fuse link crosses over the first fuse link.
Figure 6:
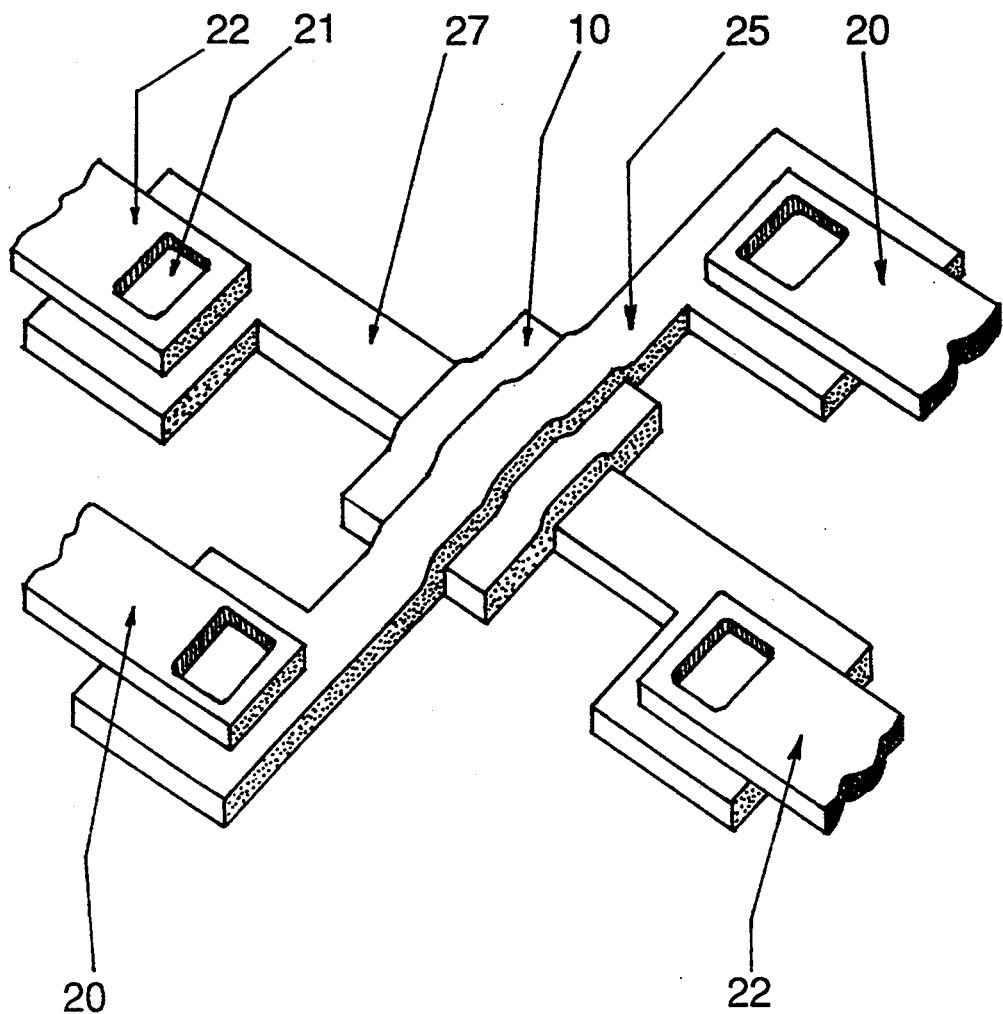
FIG. 6 is a schematic diagram of a perspective three-dimensional view of the fuse structure, wherein the second fuse link crosses under the first fuse link.

FIG. 5 shows a perspective three-dimensional view of the fuse structure, wherein the fuse link 27 crosses over the fuse link 25. As also shown in FIG. 3, the insulating and thermally conductive strip 10 separates the two links from each other. FIG. 6 is equivalent to FIG. 5, except that now the fuse link 27 passes under the link 25, with insulating strip 10 still separating the two links from each other.

Alternatively, a fuse structure such as the one previously described can also be fabricated by adding a layer of thermally conductive material placed vertically above the fuse structure. A secondary fuse can be fabricated with only part of the fuse structure crossing over the primary fuse, but ensuring that physical contact with the thermally conductive layer is maintained.

Whereas the present invention has been described having reference to particular preferred embodiments, those having skill in the art will readily appreciate that the above noted and other variations and modifications to form and detail may be made without departing from the scope and spirit of the invention.

What is claimed is:

1. In an integrated circuit having a substrate insulated by an insulating layer, a programmable fuse structure comprising:
    a pair of current carrying fuse links on said insulating layer, said fuse links in close proximity of each other;
    a layer of thermally conductive material, said layer thermally coupling and extending only over a fraction of said pair of fuse links; and
    means of programming the first link of said pair of fuse links by activating the second link of said pair of fuse links to transfer energy from said second link of said pair to said first link via said layer of thermally conductive material.

2. The programmable fuse structure as recited in claim 1, wherein said substrate is insulated by a layer of $SiO_2$ formed on said substrate.

3. The programmable fuse structure as recited in claim 1, wherein each link of said pair of fuse links has two terminals, each of said terminals is respectively attached to an interconnecting wire that provides wiring to the integrated circuit.

4. The programmable fuse structure as recited in claim 3, wherein one of said terminals of each of said fuse links share a common interconnecting line.

5. The programmable fuse structure as recited in claim 1, wherein said thermally conductive layer is an electrically insulating layer.

6. The programmable fuse structure as recited in claim 5, wherein said thermally conductivity layer is made of a material selected from a group that consists of BeO, $Al_3N_4$, and diamond.

7. The programmable fuse structure as recited in claim 1, wherein said means for programming is a voltage pulse simultaneously applied to each link of said pair of fuse links.

8. The programmable fuse structure as recited in claim 1, wherein said means for programming is a synchronized pulse that is applied sequentially to each link of said pair of fuse links.

9. The programmable fuse structure as recited in claim 1, wherein said thermally conductive layer overlaps both the first and the second links of said pair of fuse links.

10. The programmable fuse structure as recited in claim 1, wherein the first of said fuse links crosses over the second of said links.

11. The programmable fuse structure as recited in claim 1, wherein the first of said fuse links crosses under the second of said links.

12. The programmable fuse structure as recited in claim 1, further comprising:
  at least one layer of thermally insulating material blanketing said pair of fuse links and said strip of thermally conductive material.

13. In an integrated circuit having a substrate insulated by an insulating layer, a programmable fuse structure comprising:
  a pair of current carrying fuse links on said insulating layer, said fuse links in close proximity of each other;
  a layer of thermally conductive material, said layer thermally coupling and extending only over a fraction of said pair of fuse links; and
  means for programming the first link of said pair of fuse links by confining the energy generated by said first link of said pair of fuse links by having said second link gate the transfer of said energy generated by said first link via said layer of thermally conductive material.

14. The programmable fuse structure as recited in claim 13, wherein said programming occurs by a combination of the current flowing through said first link and the confined energy generated therein that is gated by said second link.

15. In an integrated circuit having a substrate insulated by an insulating layer, a programmable fuse structure comprising:
  a plurality of pairs of fuse links on the insulating layer, said fuse link within each of said pairs in close proximity of each other;
  a layer of thermally conductive material thermally coupling said plurality of pairs of fuse links, said material extending over only a fraction of each of said plurality of pairs of fuse links; and
  means of programming the fuse structure by activating one link of at least one pair of said plurality of pairs to transfer energy to the other link forming said at least one pair to be programmed via said thermally conductive material.

16. In an integrated circuit, a programmable fuse structure comprising:
  at least one fuse link on an insulating layer;
  a heating element on said insulating layer in said at least one fuse link;
  a layer of thermally conductive material, said layer thermally coupling said at least one fuse link to said heating element and covering only a fraction of said at least one fuse link and said heating element; and
  means for activating said heating element, wherein energy from said heating element is coupled to said fuse link to open said fuse link.

17. The programmable fuse structure as recited in claim 16, further comprising a plurality of said fuse links sharing said heating element.

18. The programmable fuse structure as recited in claim 16, wherein said heating element is a fuse link.

19. The programmable fuse structure as recited in claim 16, wherein said thermally conductive material is electrically insulating.

* * * * *